(12) United States Patent
Strütt et al.

(10) Patent No.: US 10,861,762 B2
(45) Date of Patent: Dec. 8, 2020

(54) ELECTRONIC MODULE INCLUDING ENCAPSULATION ENABLING ELECTRICAL CONTACT THERETHROUGH

(71) Applicant: Endress+Hauser SE+Co. KG, Maulburg (DE)

(72) Inventors: Bernd Strütt, Steinen (DE); Christian Strittmatter, Rickenbach (DE); Simon Gerwig, Schopfheim (DE); Thorsten Siedler, Birsfelden (CH); Ralf Leisinger, Wieslet (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 0 days.

(21) Appl. No.: 16/467,736

(22) PCT Filed: Oct. 30, 2017

(86) PCT No.: PCT/EP2017/077749
§ 371 (c)(1),
(2) Date: Jun. 7, 2019

(87) PCT Pub. No.: WO2018/103950
PCT Pub. Date: Jun. 14, 2018

(65) Prior Publication Data
US 2020/0066610 A1    Feb. 27, 2020

(30) Foreign Application Priority Data

Dec. 9, 2016  (DE) .......................... 10 2016 123 917

(51) Int. Cl.
*H01L 23/31*    (2006.01)
*H01L 23/498*    (2006.01)

(52) U.S. Cl.
CPC .... *H01L 23/3135* (2013.01); *H01L 23/49838* (2013.01)

(58) Field of Classification Search
CPC ........... H01L 23/3135; H01L 23/49838; H01L 2224/0392; H01L 2224/03921
See application file for complete search history.

(56) References Cited

U.S. PATENT DOCUMENTS 6,311,621 B1    11/2001  Marshall et al.
2012/0198931 A1*  8/2012  Schulze ................. G01F 15/14
                                                    73/431

(Continued)

FOREIGN PATENT DOCUMENTS

DE    102014007443 A1    11/2015
DE    202014104730 U1    1/2016
(Continued)

*Primary Examiner* — Matthew E. Gordon
(74) *Attorney, Agent, or Firm* — Christopher R. Powers; Endress+Hauser (USA) Holding Inc.

(57) ABSTRACT

The present disclosure relates to an explosion resistant electronic module having a high-speed interface and a method for electronic contacting of such electronic module via such interface. The electronic module includes an electronic component, an electrical contact area for electrical contacting the electronic component and an encapsulation, which encapsulates at least the electrical contact area. The encapsulation is embodied such that the contact area is contactable through the encapsulation by an electrical contact pin, wherein the encapsulation is filled at least in a portion with a self-healing gelatinous potting compound, which enables the encapsulation to be re-sealed after removal of the contact pin.

11 Claims, 1 Drawing Sheet

(56) References Cited

U.S. PATENT DOCUMENTS

2015/0187689 A1* 7/2015 Nashida ............ H01L 23/49575
257/774
2016/0172274 A1* 6/2016 Yoon ...................... H01L 23/66
257/664
2017/0215283 A1* 7/2017 Teo ........................ H05K 1/116

FOREIGN PATENT DOCUMENTS

| EP | 2673595 A1 | 8/2012 | |
|---|---|---|---|
| EP | 2991459 A1 | 3/2016 | |
| WO | 2008075401 A1 | 6/2008 | |
| WO | WO-2008075401 A1 * | 6/2008 | ......... H01L 23/3121 |
| WO | 2015027348 A1 | 3/2015 | |
| WO | 2015134588 A1 | 9/2015 | |

* cited by examiner

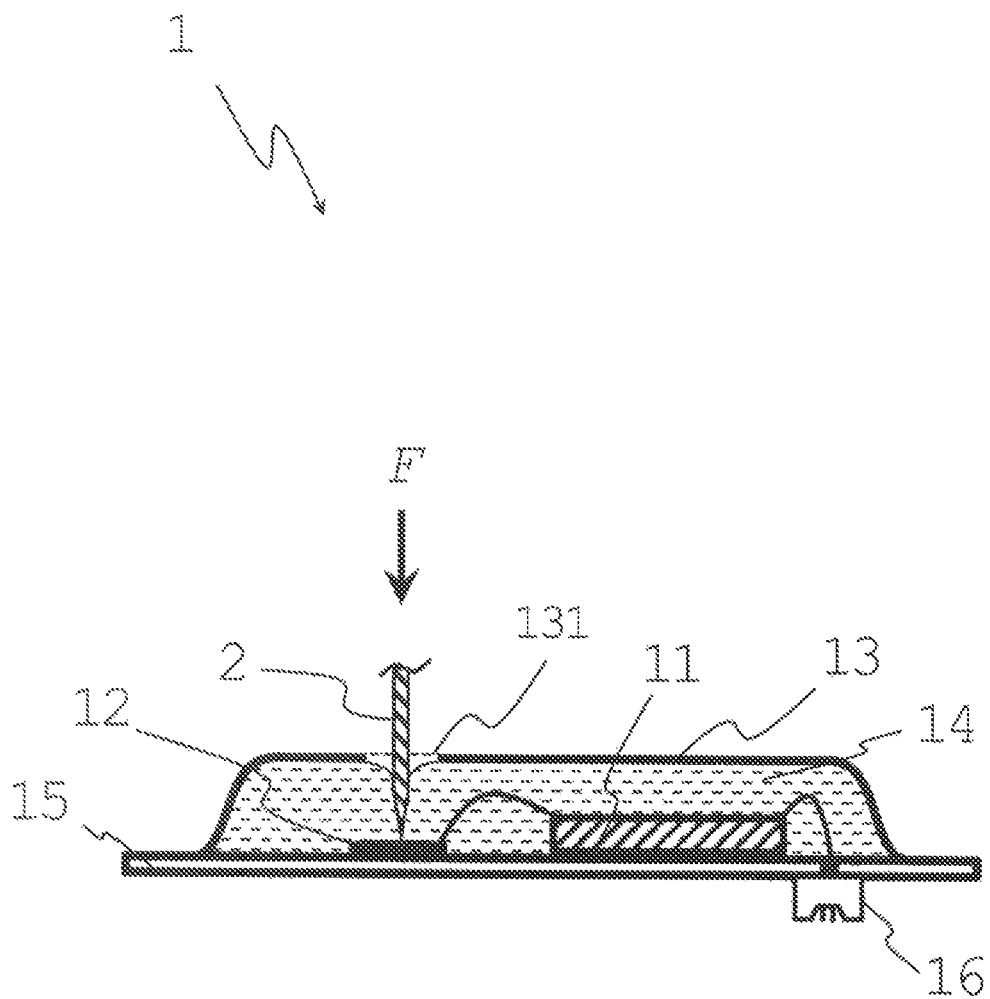

ELECTRONIC MODULE INCLUDING ENCAPSULATION ENABLING ELECTRICAL CONTACT THERETHROUGH

CROSS-REFERENCE TO RELATED APPLICATIONS

The present application is related to and claims the priority benefit of German Patent Application No. 10 2016 123 917.8, filed on Dec. 9, 2016 and International Patent Application No. PCT/EP2017/077749, filed on Oct. 30, 2017, the entire contents of which are incorporated herein by reference.

TECHNICAL FIELD

The invention relates to an electronic module as well as to a method for electrical contacting of such electronic module.

BACKGROUND

In automation technology, especially in process automation technology, field devices are often applied, which serve for registering and/or for influencing process variables. For registering process variables, sensors are applied, which are used, for example, in fill-level measuring devices, flow measuring devices, pressure and temperature measuring devices, pH-redox potential measuring devices, conductivity measuring devices, etc. They register the corresponding process variables, such as fill level, flow, pressure, temperature, pH value, redox potential and conductivity. Serving for influencing process variables are actuators, such as valves or pumps, via which the flow of a liquid in a pipe, tube or pipeline section, or the fill level in a container, can be changed. In general, all devices are referred to as field devices, which are applied near to the process and which deliver, or process, process relevant information. Therefore, in connection with the invention, the terminology, field devices, refers, supplementally, also to remote I/Os, radio adapters, and, generally, electronic components, which are employed at the field level. A large number of these field devices are manufactured and sold by the firm, Endress+Hauser.

Especially electronic modules in field devices must be encapsulated due to their special conditions of use. This serves, on the one hand, for protecting the electronic modules against process-specific environmental influences, such as dust, temperature or corrosive atmospheres. On the other hand, the encapsulation is absolutely required, since the field device (and, thus, also its electronic modules) must meet corresponding explosion protection specifications in explosion endangered areas.

Effective explosion protection measures are known from the state of the art. Corresponding specifications are set in Europe by the series of standards, EN 60079. From these, it is evident that, for explosion safe encapsulation of electronic components, among other things, pressure encapsulation and potting compound encapsulation are applied. Application of a potting compound in the framework of the standard EN 60079-18 is referred to as explosion protection type "m". Pressure resistant encapsulation of explosion protection type "d" is treated in the standard EN 60079-1.

Moreover, these explosion protection standards also concern the electrical interfaces of the electronic module, via which the module is contactable from the outside through the explosion resistant encapsulation. For meeting the explosion protection standards, it is necessary to design these interfaces that via them only a limited energy, or power, is transferable. Accordingly, also the data transmission speed of such an explosion safe interface is limited. In the case of the manufacturing of the electronic module, this is, however, disadvantageous because it significantly slows the manufacturing step of programming (also known as "flashing"). While the programming of the electronic module (often based on a microcontroller or an FPGA (field-programmable gate array)) can, for example, occur via a non-explosion protection suitable JTAG (Joint Test Action Group) or "Spy Bi Wire" interface within seconds, an adequate data transmission, for example, via an explosion resistant, digital interface requires over 10 minutes.

SUMMARY

An object of the invention, therefore, is to provide a safe electronic module for a field device.

The invention achieves this object by a corresponding electronic module. This includes, according to the invention:
At least one electronic component,
at least one electrical contact area for electrical contacting of the at least one electronic component,
an encapsulation (for example, designed as a pressure encapsulation per the standard EN 60079-1), which encapsulates at least the at least one electrical contact area.

In such case, the encapsulation of the invention is embodied at least in a portion in such a manner that the at least one electrical contact area is contactable by means of at least one electrical contact pin, for example, a spring contact pin. Furthermore, the encapsulation is filled at least between the at least one contact area and the portion with a gelatinous potting compound.

Thus, a self-healing property of the gelatinous potting compound is utilized, in that the puncture location of a contact pin in the gelatinous potting compound automatically re-seals after removal of the contact pin. In order that there can be created by means of the one or more electrical(s) contact area(s) with the electronics module at least one physical interface, which is not burdened by the limitations relative to the explosion protection related, maximum transmission speed, which, however, nevertheless can offer explosion protection, because the puncture location re-sealed by the gelatinous potting compound. In such case, there can be applied as gelatinous potting compound, for example, an elastomer, especially a SilGel® elastomer.

A very advantageous embodiment of the electronic module of the invention provides that the at least one contact area is arranged on a circuit board. In such case, it is additionally advantageous that also the electronic component is arranged on the same circuit board. In such case, the at least one contact area can be embodied, for example, as a conductive trace structure. For improvement of the contactability by the contact pin, it is advantageous, in this case, additionally, to strengthen the contact area embodied as a conductive trace by applying a (e.g., soft) solder. This strengthening of the contact area prevents in the case of the contacting by the contact pin that such in undesired manner possibly contacts other electrical structures, which are located in the vicinity of the contact areas, and, thus, in given cases, mechanically or electrically damages them.

Another preferred form of embodiment of the electronic module of the invention provides that the encapsulation encapsulates not only the electrical contact area, but, instead, also the electronic component. This is very practical from a structural point of view. The embodiment of the at least one portion of the encapsulation is possible within the scope of the invention in different ways. The portion cannot only be embodied as a hole, or opening, in order that the contact area is contactable by means of the contact pin. There can in the at least one portion be arranged also a membrane, which is penetrable with the application of a predefined force (F) on the at least one contact pin.

To provide an interface via which the electronic module of the invention can communicate by means of a fast JTAG protocol, it is advantageous that the electronic module includes for this, JTAG conformly, at least three contact areas. The contact areas are, in this case, correspondingly connected with the electronic component (in the case of which it can be a microcontroller or an FPGA). In the case where there is only a single contact area present, which is to serve as an explosion resistant and fast interface of the electronic module of the invention, it would be possible to make use of the ground connection of a possibly present, explosion safe interface of the electronic module.

Since, among others, in the case of field devices, and their components, the necessity for meeting explosion protection specifications is present, it is especially advantageous, when the electronic module of the invention is used in a field device.

The object of the invention is, correspondingly to the electronic module of the invention, additionally achieved by a corresponding method for electrical contacting of the electronic module: For electrical contacting of the electronic module in one of the above described forms of embodiment by means of at least one electrical contact pin, the method includes at least the following method step:

pressing the at least one electrical contact pin on the portion with a predefined pressing force (F), wherein the pressing force is selected in such a manner that the contact pin is pressed through the gelatinous potting compound to the contact area.

In this way, it is enabled to contact, and to program, the electronic component via the at least one contact pin, wherein the contact pin can be removed from the encapsulation after the end of the programming via the portion. In such case, the gelatinous potting compound re-seals by self-healing.

BRIEF DESCRIPTION OF THE DRAWINGS

The invention will now be explained based on the appended drawing, the sole FIGURE of which shows as follows:

FIG. 1 shows an electronic module contactable with a contact pin.

DETAILED DESCRIPTION

FIG. 1 shows a possible form of embodiment of an electronic module 1 of the invention. It is based essentially on an electronic component 11 arranged on a circuit board 15. The electronic component 11 can be, for example, a microcontroller. The electronic module 1 is encapsulated by a (e.g., pressure) encapsulation 13, whereby the electronic module 1 in the case of corresponding design of this encapsulation 13 can be used in an explosion endangered area. In the shown example of an embodiment, the encapsulation 13 encapsulates all those components 11, 12, on the circuit board 15, which in reference to the circuit board 15 are located on the side containing the electronic component 11. As a result of the encapsulation 13, the electronic module 1 is suitable, thus, e.g., for use in a field device.

In the case of the view shown in FIG. 1, the electronic module 1 includes an explosion resistant interface 16 via which at least the electronic component 11 is electrically contactable. In the shown example of an embodiment, the explosion resistant interface 16 is arranged on that side of the circuit board 15 from which the electronic component 11 faces away. Since the explosion resistant interface 16 leads out from the region of the electronic module 1 encapsulated by the encapsulation 13, the explosion resistant interface 16 must be limited in its maximum transmittable power, and, thus, in its maximum data transmission rate. A programming (or "flashing") of the electronic component 11 via the explosion resistant interface 16, for example, to be able to apply the electronic module 1 in a field device, would thus be correspondingly time intensive (e.g., because communication would be via a comparatively slow 4-20 mA protocol).

According to the invention, the electronic module 1 includes, consequently, supplementally, at least one electrical contact area 12, which is arranged within the encapsulation 13 on the circuit board 15 and is connected with the electronic component 11. For reasons of perspicuity, FIG. 1 shows only a single contact area 12. In practice, the number of contact areas 12 would depend, however, especially on the utilized interface type. The electrical contact area 12 can, thus, in the simplest case, be implemented as a conductive trace structure on the circuit board 15, where, in given cases, the conductive trace structure is reinforced by extra thickness.

In the shown example of an embodiment, the encapsulation 13 in a portion 131 above the electrical contact area 12 is so designed that the contact area 12 is contactable by means of at least one contact pin 2, for example, a spring contact pin widely used in electronics. For this, the corresponding portion 131 of the encapsulation 13 can, such as shown, be embodied, for example, as a complete opening. Another option would, however, also be that in this portion 131 a membrane is arranged (for example, a corresponding thinning of the encapsulation 13), which is penetrable in the case of application of a corresponding force F by the contact pin 2.

In order that the electronic module 1 has a suitable explosion protection after removal of the contact pin 2, in spite of the now opened portion 131, there is provided according to the invention within the encapsulation 13 supplementally a gelatinous potting compound 14, which encapsulates at least the electrical contact area 12 (and in the illustrated example of an embodiment also the electronic component 11). In this way, according to the invention, the effect is utilized that the gelatinous potting compound 14 after penetration and subsequent withdrawal of the contact pin 2 automatically re-seals, thus, it is, in effect, self-healing. This, in turn, effects in the case of corresponding design of the gelatinous potting compound 14 an explosion protection, for example, according to the standard EN 60079-11 (potting compound encapsulation). Thus, the at least one electrical contact area 12 creates a potential interface for the electronic module 1, which is not burdened relative to the electrical power and data volume restrictions of some explosion protection specifications but does meet other explosion protection specifications.

The invention claimed is:

1. An electronic module, comprising:
   at least one electronic component;
   a contact area configured to enable selectively, electrically contacting the at least one electronic component; and an encapsulation, which encapsulates at least the contact area and is adapted, at least in a portion, to enable contacting the contact area using an electrical contact pin, wherein the encapsulation is filled at least between the contact area and the portion of the encapsulation with a self-healing, gelatinous potting compound, wherein the portion of the encapsulation is an opening in the encapsulation or a membrane disposed in the portion of the encapsulation, the membrane structured to be penetrable by the electrical contact pin with application of a predefined force, and wherein the encapsulation and the potting compound are configured as to effect an explosion protection according to an explosion protection standard.

2. The electronic module of claim 1, wherein the self-healing, gelatinous potting compound is an elastomer.

3. The electronic module of claim 1, wherein the contact area is disposed on a circuit board.

4. The electronic module of claim 3, wherein the at least one electronic component is disposed on the circuit board.

5. The electronic module of claim 3, wherein the contact area is a conductive trace structure on the circuit board.

6. The electronic module of claim 1, wherein the encapsulation encapsulates the at least one electronic component.

7. The electronic module of claim 1, comprising at least three contact areas, wherein the at least one electronic component is configured to communicate using Joint Test Action Group (JTAG) protocol via the at least three contact areas.

8. The electronic module of claim 1, wherein the at least one electronic component is a microcontroller or a field-programmable gate array (FPGA).

9. A field device of process automation, comprising:
an electronic module, comprising:
at least one electronic component;
a contact area configured to enable selectively, electrically contacting the at least one electronic component; and
an encapsulation, which encapsulates at least the contact area and is adapted, at least in a portion, to enable contacting the contact area using an electrical contact pin, wherein the encapsulation is filled at least between the contact area and the portion of the encapsulation with a self-healing, gelatinous potting compound, wherein the portion of the encapsulation is an opening in the encapsulation or a membrane disposed in the portion of the encapsulation, the membrane structured to be penetrable by the electrical contact pin with application of a predefined force, and wherein the encapsulation and the potting compound are configured as to effect an explosion protection according to an explosion protection standard.

10. A method for electrically contacting an electronic module, the method comprising:
providing an electronic module, comprising:
at least one electronic component;
a contact area configured to enable selectively, electrically contacting the at least one electronic component; and
an encapsulation, which encapsulates at least the contact area and is adapted, at least in a portion, to enable contacting the contact area using an electrical contact pin, wherein the encapsulation is filled at least between the contact area and the portion of the encapsulation with a self-healing, gelatinous potting compound; and
pressing the electrical contact pin into the portion of the encapsulation with a predefined force, the predefined force selected such that the electrical contact pin is pressed through the potting compound and contacts the contact area, wherein the portion of the encapsulation is an opening in the encapsulation or a membrane disposed in the portion of the encapsulation, the membrane structured to be penetrable by the electrical contact pin with application of a predefined force, and wherein the encapsulation and the potting compound are configured as to effect an explosion protection according to an explosion protection standard.

11. The method of claim 10, wherein the at least one electronic component is programmable via the electrical contact pin, and wherein the electrical contact pin is removed from the encapsulation via the portion of the encapsulation after programming the electronic component.

* * * * *